United States Patent [19]
Bong et al.

[11] Patent Number: 4,888,566
[45] Date of Patent: Dec. 19, 1989

[54] TEMPERATURE COMPENSATED STABLE DUTY CYCLE CRYSTAL OSCILLATOR APPARATUS

[75] Inventors: Ban S. Bong, Northridge; Francis T. Yu, Conga Park; Robert Bremer, West Hills, all of Calif.

[73] Assignee: The United States of America as represented by the Secretary of the Air Force, Washington, D.C.

[21] Appl. No.: 340,360

[22] Filed: Apr. 19, 1989

[51] Int. Cl.$^4$ .............................................. H03B 5/30
[52] U.S. Cl. ................................ 331/116 R; 331/158; 331/176
[58] Field of Search .............. 331/66, 116 R, 116 FE, 331/154, 158, 176

[56] References Cited
U.S. PATENT DOCUMENTS

| | | | |
|---|---|---|---|
| 3,495,187 | 2/1970 | Jezierski et al. | 331/116 |
| 4,302,731 | 11/1981 | Ashida | 331/116 R |
| 4,550,293 | 10/1985 | Driscoll | 331/116 R |

Primary Examiner—Eugene R. LaRoche
Assistant Examiner—Robert J. Pascal
Attorney, Agent, or Firm—William Stepanishen; Donald J. Singer

[57] ABSTRACT

A temperature-compensated crystal oscillator utilizing a fundamental frequency crystal with an input RC network to bias an input transistor. Temperature compensation for the oscillator is achieved by the use of a series diode in the emitter circuit of the input transistor. As the temperature changes, the emitter-to-base voltage varies and causes the emitter current to vary in the opposite direction. The voltage across the series diode tracks with the emitter-to-base voltage in the same direction. With these occurrences, the emitter-to-collector voltage is controlled and stabilized over a range of temperature changes. The parallel RC circuit which couples the input transistor to the output drive transistor provides the necessary base current and input impedance for the output trnasistor to permit saturation of and wave shaping by the output drive transistor.

10 Claims, 1 Drawing Sheet

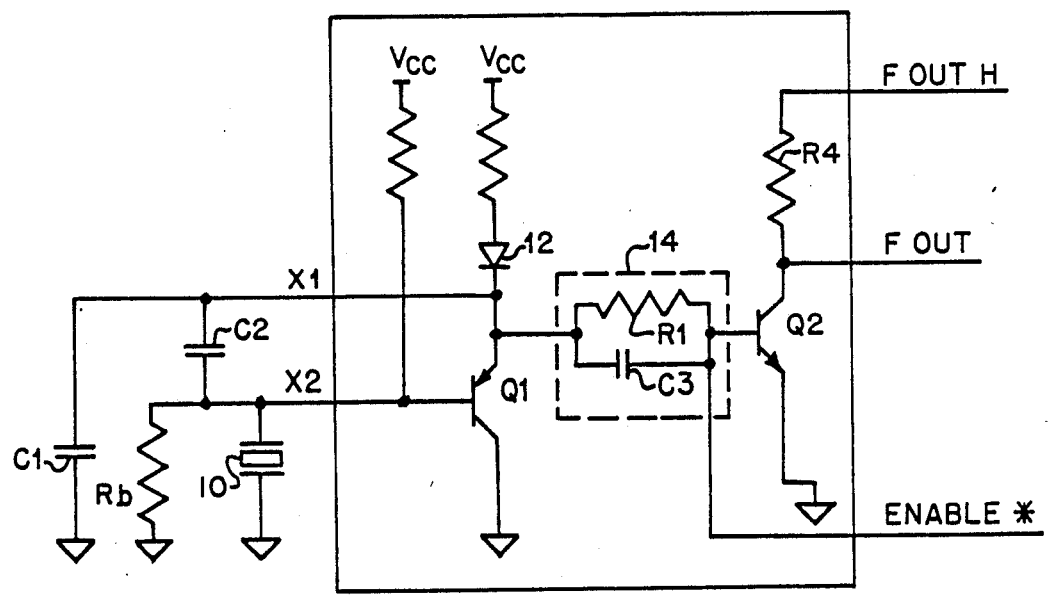

TEMPERATURE COMPENSATED STABLE DUTY CYCLE CRYSTAL OSCILLATOR APPARATUS

STATEMENT OF GOVERNMENT INTEREST

The invention described herein may be manufactured and used by or for the Government for governmental purposes without the payment of any royalty thereon.

The present invention relates broadly to a crystal oscillator apparatus, and in particular to a temperature-compensated, stable duty cycle crystal oscillator apparatus.

The state of the art of crystal oscillators is well represented and alleviated to some degree by the prior art apparatus and approaches which are contained in the following U.S. Patents:

U.S. Pat. No. 3,495,187 issued to Jezierski on Feb. 10, 1970;

U.S. Pat. No. 4,302,731 issued to Ashida on Nov. 24, 1981; and

U.S. Pat. No. 4,550,293 issued to Driscoll on Oct. 29, 1985.

The Jezierski patent discloses a crystal controlled semiconductor oscillator utilizing no inductive components and having two transistors in tandem with RC feedback circuit. A single crystal is connected across the input of the first transistor to restrict the oscillations to a harmonic of the crystal's fundamental frequency which is selected by the time constant of the feedback circuit.

The Ashida patent is directed to a temperature-compensated crystal oscillator. A control voltage for a crystal oscillation circuit is formed by adding two separately generated voltages. One of these voltages is proportionally variable with changes of temperature. The other voltage generally follows the temperature-frequency slope characteristic of the crystal unit.

The Driscoll patent describes a narrow band, voltage controlled crystal oscillator having a linear frequency versus tuning voltage response. The oscillator uses a composite resonator in a novel circuit configuration with a resulting improvement in oscillator output signal frequency stability.

In the prior art, conventional high frequency oscillators, in order to obtain a stable duty cycle at a particular frequency (Fo), would utilize a crystal oscillator circuit which was operating at a frequency (Fx) multiple of the oscillator frequency Fo and was divided down to the desired oscillator frequency.

The conventional crystal oscillator circuit works fairly well at a low frequency and in an environment where duty cycle is not a major concern. However, these conventional crystal oscillator circuits are only capable of providing a marginal TTL compatible voltage level to meet the input requirement of the TTL driver circuit.

In the recent microprocessor system designs, the operating frequency requirement has been significantly increased. The duty cycle requirement remains as stringent as 50% +/−10%. At high frequency, the conventional crystal oscillator circuit often fails to deliver the required duty cycle and drive voltage levels.

A crystal oscillator circuit is essentially the heart of a microprocessor or a digital system. The present invention can provide the stable high frequencies with duty cycle stability over military temperature range (−55° C. to +125° C.) and TTL/CMOS compatibility. This temperature-compensated crystal oscillator apparatus provides a workable solution to the problems which are associated with the stringent duty cycle requirements in high frequency operation.

SUMMARY OF THE INVENTION

The present invention utilizes a fundamental frequency crystal-controlled oscillator apparatus which is temperature-compensated to provide a stable duty cycle and output voltage levels that are compatible to drive TTL/CMOS circuits. The crystal-controlled oscillator apparatus provides a stable high frequency output signal up to 25 MHz with rise and fall times of less than 10 nSec.

It is one object of the present invention, therefore, to provide an improved crystal oscillator apparatus having a controlled/stabilized Fo duty cycle over a wide temperature range.

It is another object of the prevent invention to provide an improved crystal oscillator apparatus which has a TTL/CMOS compatible Fo voltage swing with a wide margin.

It is yet another object of the present invention to provide an improved crystal oscillator apparatus having a high frequency output up to 25 MHz utilizing a single fundamental frequency crystal.

It still another object of the present invention to provide an improved crystal oscillator apparatus that is a simple design and a low technical risk.

It is another object of the present invention to provide an improved crystal oscillator apparatus which is insensitive to mechanical implementation.

It is still another object of the present invention to provide an improved crystal oscillator apparatus which is economical to produce and utilizes conventional, currently available components that lend themselves to standard mass production manufacturing techniques.

These and other advantages, objects and features of the invention will become more apparent after considering the following description taken in conjunction with the illustrative embodiment in the accompanying drawings.

BRIEF DESCRIPTION OF THE DRAWINGS The sole FIGURE is a schematic diagram of the temperature-compensated stable duty cycle crystal oscillator apparatus according to the present invention.

DESCRIPTION OF THE PREFERRED EMBODIMENT

Referring now to the sole FIGURE, there is shown a crystal-controlled oscillator apparatus utilizing a crystal 10 which operates at a fundamental frequency Fo. The component values of capacitors C1, C2 and resistor Rb are adjusted in accordance with the fundamental frequency, Fo of crystal 10 to bias transistor Q1 for different frequency crystals. A diode 12 is connected to the emitter of transistor Q1 to provide temperature compensation for voltage and current variations in transistor Q1. The emitter of transistor Q1 is connected to the base of transistor Q2 by the parallel circuit 14 which is comprised of resistor R1 and capacitor C3. An enable* line is connected to the junction of the parallel circuit 14 and the base of transistor Q2. The output signal, F OUT of the oscillator circuit appears at the collector of transistor Q2. The output signal, F OUT H which may be adjusted to accommodate different TTL/CMOS circuit loads, is connected to the collector of transistor Q2 by resistor, R4.

The most important feature of this crystal oscillator apparatus is providing a controlled output Fo duty cycle and a sufficient voltage swing for TTL or CMOS load over the operating temperature range. The duty cycle of the fundamental frequency Fo is substantially stable and varies only +/−1.5% over the temperature range of −55° C. to +110° C. The crystal oscillator apparatus utilizes a diode 12 in the emitter of transistor Q1 to provide automatic temperature compensation to yield a low variation in output duty cycle. The Fo output voltage swing can be controlled to drive TTL or CMOS load with sufficient margin. A fast rise and fall time, typically less than 10 nSec is ensured by the output stage transistor (Q2). The circuit as shown and described in the sole FIGURE can generate a fundamental frequency Fo up to 25 MHz by merely utilizing a single fundamental frequency crystal. A fundamental frequency crystal oscillator circuit is inherently simpler and more reliable in design than the prior art "overtone" circuits. The specific coupling circuit which is employed in this apparatus makes the overall circuit less sensitive to mechanical implementation. The components are used in this circuit are common passive devices and transistors which yields a lower cost in implementation. All of the above features are achieved by the temperature-compensated stable duty cycle crystal oscillator apparatus which is shown in the sole FIGURE. The important technical features of the present invention can be briefly summarized as follows:

1. The temperature compensation of the circuit is achieved by the use of the diode in series with the Q1 emitter. As the temperature changes, Vbe of transistor Q1 varies and causes the emitter current to vary in the opposite direction. The voltage across the series diode, however, tracks with Vbe in the same direction. With these combinations, the Vce of transistor Q1 becomes better controlled and stabilized over temperature range.
2. The parallel RC network coupling transistors Q1 and Q2 provides the necessary base current and input impedance to transistor Q2 for saturating that transistor and wave shaping.
3. The parallel RC coupling network also reduces the stray capacitance effect on the wire between the emitter of transistor Q1 and to the RC coupling network. This relieves the layout constrain between the two stages of transistors. A reasonable long wire between the two stages becomes tolerable.
4. The transistor Q2 is used as a saturation switch to provide sufficient "F OUT" voltage swing for TTL and CMOS interface. The "F OUT H" is provided for meeting various higher loading requirements.
5. The transistor Q1 has to be rebiased for different frequency crystals. The biasing is done by varying the component values of elements C1, Cf and Rb.
6. The crystal (Xtal) must be operated at its fundamental mode.
7. The ENABLE* line may be provided to inhibit the F OUT from oscillating when grounded.

Although the invention has been described with reference to a particular embodiment, it will be understood to those skilled in the art that the invention is capable of a variety of alternative embodiments within the spirit and scope of the appended claims.

What is claimed is:

1. A temperature-compensated stable duty cycle crystal oscillator apparatus comprising in combination:
    a first transistor having an emitter, base and collector,
    means for biasing, said biasing means operatively connected between said base and said emitter of said first transistor, said collector of said first transistor being connected to ground,
    means for oscillating, said oscillating means operatively connected between ground and said base of said first transistor,
    means for temperature compensation, said temperature compensation means operatively connected in series with said emitter of said first transistor,
    means for coupling, said coupling means operatively connected to said emitter of said first transistor, and
    a second transistor having an emitter, base and collector, said emitter of said second transistor operatively connected to ground, said base of said second transistor operatively connected to said coupling means, said coupling means providing base currents and input impedance to said second transistor for saturating said second transistor and for wave shaping the output signal therefrom, said output signal appearing on said collector of said second transistor.

2. A crystal oscillator apparatus as described in claim 1 wherein said biasing means comprises in combination:
    a first resistor operatively connected between ground and said base of said first transistor,
    a first capacitor operatively connected between ground and said emitter of said first transistor, and,
    a second capacitor operatively connected between said emitter and said base of said first transistor.

3. A crystal oscillator apparatus as described in claim 1 wherein said temperature compensation means comprises a diode in series with said emitter of said first transistor.

4. A crystal oscillator apparatus as described in claim 1 wherein said coupling means comprises a resistor and capacitor which are operatively connected in parallel.

5. A crystal oscillator apparatus as described in claim 1 wherein said oscillating means comprises a crystal.

6. A crystal oscillator apparatus as described in claim 1 wherein including a means for enable control, said enable control means operatively connected to said base of said second transistor.

7. A crystal oscillator apparatus as described in claim 1 further including a means for impedance, said impedance means operatively connected to said collector of said second transistor to provide a drive signal.

8. A crystal oscillator apparatus as described in claim 3 wherein said diode has an anode and a cathode, said cathode operatively connected to said emitter of said first transistor and said anode operatively connected to a bias supply.

9. A crystal oscillator apparatus as described in claim 5 wherein said crystal oscillates at a fundamental frequency.

10. A crystal oscillator apparatus as described in claim 9 wherein said fundamental frequency is up to 25 MHz.

* * * * *